(12) United States Patent
Sakai et al.

(10) Patent No.: US 6,861,588 B2
(45) Date of Patent: Mar. 1, 2005

(54) LAMINATED CERAMIC ELECTRONIC COMPONENT AND METHOD OF PRODUCING THE SAME

(75) Inventors: Norio Sakai, Moriyama (JP); Mitsuyoshi Nishide, Shiga-ken (JP); Masaaki Mizushiro, Moriyama (JP); Kenji Kubota, Sabae (JP); Nobuyuki Suzuki, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/620,096

(22) Filed: Jul. 15, 2003

(65) Prior Publication Data

US 2004/0022043 A1 Feb. 5, 2004

(30) Foreign Application Priority Data

Jul. 16, 2002 (JP) ........................................ 2002-207167

(51) Int. Cl.[7] .............................................. H01L 23/02
(52) U.S. Cl. ..................... 174/52.4; 174/52.2; 257/696; 257/693; 257/737
(58) Field of Search .............................. 174/52.4, 52.2; 257/692, 696, 737

(56) References Cited

U.S. PATENT DOCUMENTS

| | | | | |
|---|---|---|---|---|
| 4,736,520 A | * | 4/1988 | Morris ........................ 29/827 |
| 4,890,194 A | * | 12/1989 | Derryberry et al. ......... 165/185 |
| 5,138,115 A | * | 8/1992 | Lam .......................... 174/52.4 |
| 5,157,480 A | * | 10/1992 | McSahne et al. ........... 257/693 |
| 5,241,133 A | * | 8/1993 | Mullen, III et al. ....... 174/52.4 |

FOREIGN PATENT DOCUMENTS

| | | |
|---|---|---|
| JP | 63-288091 | 11/1988 |
| JP | 02-230790 | 9/1990 |
| JP | 08-097529 | 4/1996 |
| JP | 2002-198637 | 7/2002 |
| JP | 2002-222899 | 8/2002 |

* cited by examiner

Primary Examiner—Hung V. Ngo
(74) Attorney, Agent, or Firm—Keating & Bennett, LLP

(57) ABSTRACT

A laminated ceramic electronic component includes an embedded portion formed in the periphery of an external terminal electrode so as to extend and be embedded in a component main member defined by ceramic layers, whereby affects of a small edge angle are eliminated.

12 Claims, 14 Drawing Sheets

LAMINATED CERAMIC ELECTRONIC COMPONENT AND METHOD OF PRODUCING THE SAME

BACKGROUND OF THE INVENTION

1. Field of the Invention

The present invention relates to a laminated ceramic electronic component and a method of producing the same. Particularly, the present invention relates to the structure of an external terminal electrode of a laminated ceramic electronic component such as a laminated ceramic substrate and a method of forming the same.

2. Description of the Related Art

In many cases, electronic components such as chip antennas, delay lines, high frequency composite switch modules, and reception devices are made using laminated ceramic electronic components. The laminated ceramic electronic components are mounted on appropriate mounting substrates. Accordingly, the electronic components include external terminal electrodes which are connected to the mounting substrates.

FIG. 9 is a cross-sectional view of a portion of a prior art laminated ceramic electronic component 1 which is relevant to the present invention, in which an external terminal electrode 2 is provided.

A laminated ceramic electronic component 1 includes a main member 4 composed of a plurality of laminated ceramic layers 3, an internal conductor film 5 which defines an internal circuit element provided inside of the main member 4, and a via-hole conductor 6. The external terminal electrode 2 is provided on the first major surface 7 of the main member 4 which extends in the same direction as the laminated ceramic layers 3, and is electrically connected to a mounting substrate not shown in FIG. 9.

Ordinarily, the external terminal electrode 2 is formed by baking electro-conductive paste.

In some cases, such an external terminal electrode 2 is formed by applying conductive paste on the main surface 7 of the main member 4 after sintering, and baking the conductive paste. From the standpoint of high efficiency and low cost of processing, advantageously, the baking of the conductive paste to form the external terminal electrode 2 is performed at the same time that the ceramic is fired. Therefore, preferably, the conductive paste which forms the external terminal electrode 2 is applied on a ceramic green sheet for the ceramic layer 3 or is applied on the main surface 7 of the main member 4 before firing, i.e., in the green state, and is fired at the same time that the green main member 4 is fired to obtained the sintered main member 4.

In some cases, plating with nickel and gold or plating with nickel and tin is performed.

When the laminated ceramic electronic component 1 is used in a high frequency band, especially, in a frequency band of several hundred MHz to several GHz, to reduce the insertion loss of a high frequency signal, the external terminal electrode 2, as well as internal circuit elements such as the internal conductor film 5 and the viahole conductor 6, preferably has a low resistance, is tight, and has outstanding surface smoothness. In addition, the edge angle θ of the external terminal electrode 2 must be relatively large.

The low resistance of the external terminal electrode 2 may be achieved by using a low resistant material, such as silver and copper, as a conductive component of conductive paste which forms the external terminal electrode 2. Silver and copper have a relatively low melting point. Thus, when baking the external terminal electrode 2 and firing the laminated ceramic layers 3 at the same time as described above, a low temperature sintering ceramic material, which may be sintered at a temperature of about 1000° C. or less, is used as a ceramic material for forming the laminated ceramic layers 3.

Moreover, the tightness and the outstanding surface smoothness of the external terminal electrode 2 is easily achieved by optimization of the composition of conductive paste of the external terminal electrode 2 and the baking conditions of the conductive paste.

However, it is very difficult to increase the edge angle θ of the external terminal electrode 2 to the required edge angle. This will be described below.

First, the small edge angle θ of the external terminal electrode 2 is caused as follows.

When conductive paste for forming the external terminal electrode 2 is applied by screen printing, the conductive paste adheres to the peripheral edge of a patterning portion of the screen plate through which the conductive paste is passed. Thus, the thickness of a conductive paste film of the external terminal electrode 2 is decreased in the peripheral portion.

Moreover, the conductive paste film is broken by pressing. As a result, usually, the edge angle θ of the external terminal electrode 2 is in the range of 10 to 25 degrees.

The size A of a thinning top portion of the external terminal electrode 2, which defines the edge angle θ, is typically in the range of about 30 μm, depending upon the thickness, the area and the shape of the external terminal electrode 2.

To increase the edge angle θ, the following methods have been proposed: (1) the thickness of the conductive paste film is increased; (2) a setting resin is added to the conductive paste to prevent the conductive paste film from being crushed; and (3) the thickness of the edge of the formed external terminal electrode 2 is increased by etching of metal foil, formation of metal foil by photolithography or active plating, or etching using photosensitive paste, such that the edge angle θ is increased.

However, when the method (1) is used, the difference between the firing-shrinkage behaviors of the conductive paste of the external terminal electrode 2 and the ceramic of the ceramic layers 3 is increased.

Therefore, cracks form in the sintered main member 4, voids (cavities) form beneath the external terminal electrode 2, and the electrical insulating property of the laminated ceramic layers 3 deteriorates due to invasion of a plating liquid. Thus, the Q value of the main member 4 is reduced, such that the high frequency characteristic is deteriorated. Moreover, the main member 4 is often deformed or distorted, such that the co-planarity is reduced. This deteriorates the reliability of the connection between the laminated ceramic electronic component 1 and an appropriate mounting substrate on which the component 1 is mounted, and also the reliability of the connection between the main member 4 and mounting components, such as ICs, which are mounted on the main member 4.

In the case in which the method (2) is used, the conductive paste is supplied onto the screen plate, and then, the paste may be cured component-by-component or time-dependently. Thus, the printing property of the paste is deteriorated.

Moreover, it is difficult to smoothly remove the setting resin in the firing process. This causes generation of voids or delamination.

Moreover, to dry ordinary conductive paste, it is sufficient to heat the paste at about 100° C. for about 2 minutes. On the other hand, for the paste having the setting resin added thereto, the setting resin must also be set. Thus, the drying conditions must be more severe. For example, drying is performed at a temperature of about 150° C. for about 5 minutes. Accordingly, for the conductive paste applied to a ceramic green sheet, a plasticizer, provided in the ceramic green sheet, is often removed in the drying process. Therefore, the ceramic green sheet becomes brittle. Thus, the green sheet may be broken or cracked when handled. Moreover, the ceramic green sheet, when dried, shrinks to a much greater degree. Thus, when a plurality of the ceramic green sheets are laminated, positional shifting is caused.

When the method (3) is used, e.g., processes of coating and exposing a photoresist, peeling the photo-resist, etching, and rinsing with water, the cost increases due to the additional processes required. Thus, the method is unsuitable for practical applications.

As seen in the above-description, no method of the related art for decreasing the edge angle θ of the external terminal electrode 2 is suitable.

When the laminated ceramic electronic component 1 is a multilayer ceramic substrate, for example, the size must be reduced and the wiring density must be increased, and hence, different types of circuits are provided therein, and the functions of the substrate are combined. Accordingly, it is necessary to increase the number of the external terminal electrodes 2. Therefore, the area of each external terminal electrode 1 must be reduced. The thickness of conductive paste applied to form an external terminal electrode 2 with such a small area is further reduced. As a result, the edge angle θ is further reduced.

More specifically, the following problems are caused when the edge angle θ of the external terminal electrode 2 is small.

FIG. 10 is a schematic cross-sectional view of the external terminal electrode 2 which is connected to the viahole conductor 6 in the laminated ceramic electronic component 1.

Referring to FIG. 10, when a small current flows from the viahole conductor 6 into the external terminal electrode 2, a substantial surface-skin effect is caused. Thus, as shown in arrow 8, the current flows in the vicinity of the surface of the external terminal electrode 2. Accordingly, as the edge angle θ of the external terminal electrode 2 is reduced, the loss increases. Table 1 shows the determination results of the relationship between the edge angle θ and the loss.

| Edge angle θ (degree) | Loss |
| --- | --- |
| 17 | 1.00 |
| 25 | 0.91 |
| 32 | 0.89 |
| 90 | 0.75 |
| Half-circular shape | 0.74 |

Table 1 shows the loss occurring when a high frequency signal is passed through the external terminal electrode 2. The loss is expressed by a relative value obtained when the angle θ of 17 degrees is taken as 1.00.

As seen in the Table 1, it is desirable that the edge angle θ is increased for reduction of the loss.

FIG. 11 is a schematic cross-sectional view of two adjacent external terminal electrodes 2 connected to two viahole conductors 6 in the laminated ceramic electronic component 1, respectively.

Referring to FIG. 11, while the sizes of the laminated ceramic electronic components 1 defining the multi-layer ceramic substrates are reduced, due to the reduction in size, the increasing densities, and the composite-structures of such components, the number of required the external terminal electrodes 2 is increased. Simultaneously, the gap 9 between the adjacent external terminal electrode 2 is reduced to be, e.g., in the range of about 0.1 mm to about 0.4 mm. In this case, if the edge angles θ of the external terminal electrodes 2 are small, electric fields are concentrated on the tops of the edges, such that current tends to flow between the two adjacent external terminal electrodes 2, which greatly reduces the withstand voltage. For example, when the laminated ceramic electronic component 1 is used in transmission systems of communication devices and automotive components, where large currents flow, the above-described problems are more severe.

FIG. 12 is a schematic view showing the state of the laminated ceramic electronic component 1 of FIG. 9 mounted on the mounting substrate 10.

In FIG. 12, the main member 4 of the laminated ceramic electronic component 1 is schematically shown, and the mounting substrate 10 is also schematically shown. A mounting component 11 is mounted on the main member 4. A metal cover 12 is fixed to the main member 4 so as to cover the mounting component 11.

When the laminated ceramic electronic component 1 is provided for high frequency use, for enhancement of electrical properties, it is important to secure the grounding when the laminated ceramic electronic component 1 is mounted. Thus, in the laminated ceramic electronic component 1, a grounding conductor (not shown) is arranged in the main member 4 in the vicinity to the mounting substrate 10. In addition, a grounding conductor 13 is arranged in the mounting substrate 10 in the vicinity to the surface thereof, such that the potential of the grounding conductor 13 is about the same as that of the grounding conductor provided on the main member 4 side.

In the mounting structure shown in FIG. 12, the external terminal electrode 2 functions as a microstrip line. The loss caused by the microstrip line is influenced by the edge angle θ in the edge of the microstrip line, i.e., in the edge of the external terminal electrode 2 surrounded by a broken line circle in FIG. 12. As the edge angle θ decreases, the loss increases.

Referring to FIG. 9 again, the edge angle θ of the external terminal electrode 2 is small, and therefore, the thickness of the edge is reduced. For this reason, if a low temperature sintering ceramic material including a glass component is used for the laminated ceramic layers 3, the glass component is exposed at the edge, which deteriorates the plating property of the material. Accordingly, it is difficult to properly deposit a plating film made of tin or other suitable material on the external terminal electrode 2. As a result, the soldering property is reduced, and the reliability of the connection to the mounting substrate is deteriorated. Moreover, if copper, which tends to oxidize, is used as a conductive component of the external terminal electrode 2, and the plating property is inferior, the copper is exposed and is easily oxidized. This reduces the reliability of the connection.

As described above, a small edge angle θ of the external terminal electrode 2 causes various problems. However, it is difficult to increase edge angle θ of the external terminal electrode 2 according to the known method.

SUMMARY OF THE INVENTION

To overcome the problems described above, preferred embodiments of the present invention provide a laminated ceramic electronic component and a method of producing the same, in which the problems described above, caused by the small edge angle of the external terminal electrode, are solved not by increasing the edge angle but by other methods.

According to a preferred embodiment of the present invention, a laminated ceramic electronic component which is mounted on an appropriate mounting substrate, for example, a printed circuit board, includes a component main member made of a plurality of laminated ceramic layers, an internal circuit element provided inside the component main member, and an external terminal electrode provided on a first main surface of the component main member extended in the same direction as the ceramic layers and electrically connected to the mounting substrate.

The external terminal electrode is formed by baking conductive paste, and to solve the above-described technical problems, includes an exposed portion exposed at the first main surface and an embedded portion extending in at least a component of the peripheral edge of the exposed portion so as to be embedded in the component main member.

Preferably, the embedded portion includes a first bending portion provided in the peripheral edge of the exposed portion of the external terminal electrode. Moreover, the embedded portion preferably includes a second bending portion connected to the first bending portion.

Preferably, the embedded portion has a length of at least about 30 μm in parallel to the first main surface of the component main member.

Preferably, the external terminal electrode is electrically connected to the internal circuit element.

Preferably, the peripheral edge of the external terminal electrode includes an arc-shaped area in the plan view.

Another preferred embodiment of the present invention provides a method of producing a laminated ceramic electronic component having the above-described features.

According to a first preferred embodiment of the method of producing a laminated ceramic electronic component, the method includes the step of forming a green laminate main member with a plurality of laminated ceramic green sheets, the green laminate main member including an internal circuit element formed therein, and forming on a first main surface of the green laminate main member extending in the same direction as the ceramic green sheets, an external terminal electrode which is electrically connected to the mounting substrate.

The step of forming the green laminate main member includes a step of molding the green laminate main member such that a region which is on the first main surface side of the green laminate main member and where the external terminal electrode is to be formed includes a convexity.

The step of forming the external terminal electrode includes the steps of preparing a ceramic green sheet for an outer layer which is lined with a carrier film and includes a hole in a region corresponding to the convexity such that the carrier film is exposed through the hole, forming a conductive paste film which defines the external terminal electrode, so as to extend from the carrier film exposed through the hole to the peripheral edge portion of the hole, laminating the outer-layer ceramic green sheet lined with the carrier film on the green laminate main member while the hole and the convexity are arranged to oppose each other to form a green component main member, peeling off the carrier film from the outer-layer ceramic green sheet, and pressing the green component main member in the lamination direction.

Moreover, the method preferably includes a step of firing the green component main member.

Preferably, the step of preparing the outer-layer ceramic green sheet includes a step of removing the outer-layer ceramic green sheet lined with the carrier film from the carrier film in the region corresponding to the convexity, whereby the hole is formed in the outer-layer ceramic green sheet.

Also, preferably, the conductive paste film is formed so as to extend on the peripheral edge portion of the hole in a width of at least about 30 μm.

Preferably, no conductive paste film is formed on the outer-layer green sheet other than at the peripheral edge portion of the hole.

Preferably, the step of molding the green laminate main member includes a step of pressing the green laminate member in the lamination direction using a metallic mold having a concavity corresponding to the convex portion.

According to a second preferred embodiment of the method of producing a laminated ceramic electronic component according to the present invention, the method includes the steps of forming a green laminate main member with a plurality of laminated ceramic green sheets, the green laminate main member includes an internal circuit element formed therein, the green laminate main member includes a conductive paste film, which is to be an external terminal electrode electrically connected to the mounting substrate, on a first main surface of the green laminate main member extending in the same direction as the ceramic green sheets. Then, the green laminate main member is successively molded such that a convexity is formed in a region which is on the first main surface side of the green laminate main member and includes the conductive paste formed thereon, a concavity is formed in a region where no external terminal electrode is to be formed, and the conductive paste film is also provided in the boundary portion between the convexity and the concavity.

On the other hand, an outer-layer ceramic green sheet is prepared which includes a hole formed in a region corresponding to the convexity.

Next, the outer-layer ceramic green sheet is laminated on the green laminate main member while the hole and the convexity are arranged so as to oppose each other to define a green component main member.

Subsequently, the green component main member is pressed in the lamination direction.

Then, the green component main member is fired. Thus, the laminated ceramic electronic component is produced.

Preferably, the conductive paste film is formed in a region having a width of at least about 30 μm more than the region where the external terminal electrode is to be formed.

Preferably, the conductive past film is not formed in any other region of the first main surface side of the green laminate main member other than the boundary portion between the convexity and concavity.

Also, preferably, the step of molding the green laminate main member includes a step of pressing the green laminate main member in the lamination direction using a metallic mold having a concavity corresponding to the convexity and a convexity corresponding to the concavity.

In the laminated ceramic electronic component according to preferred embodiments of the present invention, the external terminal electrodes are formed by baking conductive paste. Although a thinning portion having a small edge angle is formed in the periphery of the external terminal electrode, at least a component of the peripheral edge portion of the external terminal electrode includes an embedded portion which extends and is embedded in the component main member. This eliminates the affects of the thinning portion. Accordingly, affects of the thinning portion are greatly reduced even under high frequency conditions. Thus, the high frequency characteristics are greatly improved.

Even if two external terminal electrodes are arranged adjacent to each other, the reliability of the withstanding voltage is greatly improved, since the peripheral edges of the thinning portions are embedded in the component main member which has an electrical insulating property.

When plating is performed for the external terminal electrode, a sufficient plating-thickness is provided on the portion of the external terminal electrode exposed from the component main member. The coverage is superior. Thus, sufficient plating is achieved.

When the embedded portion extends in the component main member a length of at least about 30 μm, the peripheral edge of the thinning portion is securely embedded in the component main member. The above-described advantages are thus achieved.

According to another preferred embodiment of the method of producing a laminated ceramic electronic component of the present invention, the green laminate main member is molded such that a region which is on the first main surface side of the green laminate main member and where the external terminal electrode is to be formed is a convexity. To form the external terminal electrode, a ceramic green sheet defining an outer layer is prepared which is lined with a carrier film and which includes a hole formed in a region corresponding to the convexity such that the carrier film is exposed through the hole. A conductive paste film for forming the external terminal electrode is formed so as to extend from the carrier film exposed through the hole to the peripheral edge portion of the hole. The outer-layer ceramic green sheet lined with the carrier film is laminated on the green laminate main member while the hole and the convexity are arranged opposite to each other to form a green component main member. Then, the carrier film is peeled off from the outer-layer ceramic green sheet. The green component main member is then pressed in the lamination direction. Thus, the external terminal electrode having the embedded portion is easily formed.

According to another preferred embodiment of the method of producing a laminated ceramic electronic component of the present invention, the green laminate main member having a conductive paste film, which is to be an external terminal electrode, is formed on the first main surface. The green laminate main member is molded such that a convexity is formed in a region which is on the first main surface side of the green laminate main member and which has the conductive paste formed thereon, a concavity is formed in a region where no external terminal electrode is to be formed, and the conductive paste film is also provided in the boundary portion between the convexity and the concavity. An outer-layer ceramic green sheet having a hole formed in a region corresponding to the convexity is prepared. The outer-layer ceramic green sheet is laminated onto the green laminate main member while the hole and the convexity are arranged to oppose each other to form a green component main member. Subsequently, the green component main member is pressed in the lamination direction. Thus, the external terminal electrode having the embedded portion is easily formed.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1A:
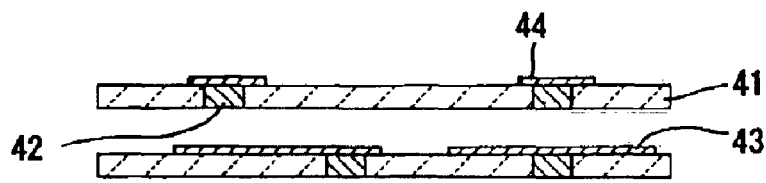
FIGS. 1A to 1D illustrate a fist preferred embodiment of the present invention, sequentially showing, in cross-sections, processes of producing a laminated ceramic electronic component 21 shown in FIG. 1D.
Figure 1B:
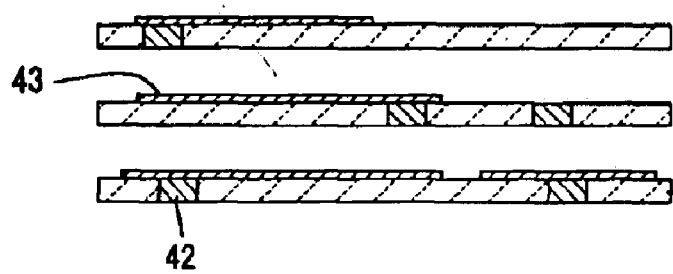
Figure 1C:
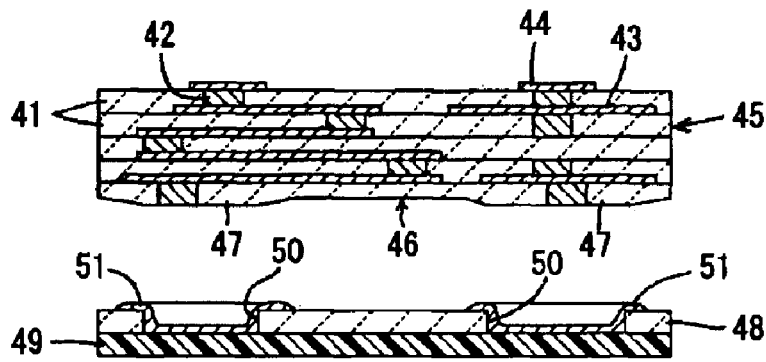
Figure 1D:
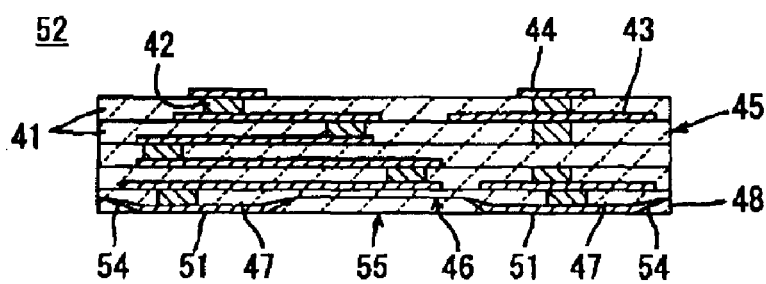

FIGS. 1A to 1D illustrate a first preferred embodiment of the present invention. FIG. 1D is a cross-sectional view of a laminated ceramic electronic component 21. FIGS. 1A to 1C sequentially illustrate, in cross-sections, the processes of producing the laminated ceramic electronic component 21.

Referring to FIG. 1D, the laminated ceramic electronic component 21 includes a main member 23, several internal conductor films 24 provided as internal circuit elements inside of the main member 23, and several viahole conductors 25, which are formed using a plurality of laminated ceramic layers 22. The internal conductor films 24 and the viahole conductors 25 are electrically connected to each other, and define wirings required in the laminated ceramic electronic component 21 and also define passive elements such as capacitors and/or inductors.

Several external terminal electrodes 27 are provided on a first main surface 26 of the main member 23 extending in the same direction as the laminated ceramic layers 22. An external terminal electrode is electrically connected to a respective viahole conductor 25. When the laminated ceramic electronic component 21 is mounted on an appropriate mounting substrate (not shown), these external terminal electrodes 27 are electrically connected to the mounting substrate.

Several external conductor films 29 are provided on the second main surface 28 of the main member 23. An external conductor film 29 is electrically connected to a respective viahole conductor 25. The external conductor films 29 define wirings required in the laminated ceramic electronic component 21, and are used as conduction lands for electrical connection of mounting components 30, shown by the broken lines, such as ICs and other chip components mounted on the main member 23.

A metal cover 31 is fixed to the main member 23 so as to cover the mounting component, if necessary, as shown by the broken line.

The external terminal electrodes 27 on the first main surface 26 of the laminated ceramic electronic component 21 is formed by baking conductive paste. Each of the external terminal electrodes 27 includes an exposed portion that is exposed on the main surface 26 of the main member 23 and an embedded portion 32 composed of at least a component of the peripheral edge of the exposed portion which extends so as to be embedded inside of the main member 23.

The following processes are performed to produce the laminated ceramic electronic component 21.

First, as shown in FIG. 1A, a plurality of ceramic green sheets 41 are prepared. The ceramic green sheets 41 are produced by mixing a binder, a plasticizer, a dispersant, and a solvent with a powdery ceramic raw material such as a low temperature sintering ceramic material, and forming the produced slurry into a sheet-shape. The sheet has a thickness of about 10 $\mu$m to about 200 $\mu$m. To form the slurry into a sheet-shape, a carrier film made of resin such as a polyethyleneterephthalate or other suitable material, having a thickness of about 50 $\mu$m to about 100 $\mu$m is preferably used. The slurry is applied on the carrier film by a doctor-blade, a die coater, or a reverse roll coater, or other suitable member.

Perforations having a diameter of about 50 $\mu$m to about 200 $\mu$m for forming viahole conductors 25 are formed in predetermined ceramic green sheets 41. Conductive paste including silver or copper as a conductive component is filled into each perforation. Thus, conductive paste members 42 defining the viahole conductors 25 are formed.

The conductive paste as described above is screen-printed. Thus, conductive paste films 43 defining internal conductor films 24 are formed in the predetermined ceramic green sheets 41. Moreover, conductive paste films 44 defining the external conductor films 29 are formed on the ceramic green sheet 41 defining the uppermost layer.

Next, as shown in the upper component of FIG. 1B, a plurality of the ceramic green sheets 41 are laminated to form a green laminated main member 45.

The green laminated main member 45 is processed such that a convexity 47 is molded on the first main surface 46 extending in the same direction as the ceramic green sheets 41 and in the region where the external terminal electrode 27 is to be formed as shown in FIG. 1D. A mold (not shown) having a concavity corresponding to the convexity 47 is preferably used to press the green laminated main member 45 in the lamination direction. For the pressing, a pressure of about 100 kg/cm$^2$ to about 1500 kg/cm$^2$ and a temperature in the range of room temperature to about 150° C. are applied.

Preferably, the rising-end portions of the convexity 47 are sloped surfaces, respectively, as shown in FIG. 1B.

On the other hand, a ceramic green sheet 48 defining the outer layer having the same composition as the ceramic green sheets 41 is prepared as shown in FIG. 1B. The outer-layer ceramic green sheet 48 is processed as follows, while the sheet 48 is lined with a carrier film 49 used for the molding.

First, a continuous hole-wall is formed in the outer-layer ceramic green sheet 48 such that the hole-wall does not pass through the carrier film 49 by means of, e.g., a laser or other suitable member or process. The component of the outer-layer ceramic green sheet 48 surrounded by the hole-wall is peeled off, such that the outer-layer ceramic green sheet 48 in the region corresponding to the above-described convexity 47 is removed from the carrier film 49. Thus, a hole 50 which exposes the carrier film 49 is formed in the outer-layer ceramic green sheet 48.

Regarding the production of the outer-layer ceramic green sheet 48 provided with the hole 50, e.g., screen-printing may be applied on the carrier film 49 such that the outer-layer ceramic green sheet 48 is formed together with the hole 50.

Subsequently, the same conductive paste as that described above is screen-printed such that the paste is placed on the carrier film 49 exposed in the hole 50 to be filled into the hole 50 to the periphery of the hole 50 formed in the outer-layer ceramic green sheet 48. Thus, a conductive paste film 51, which defines the external terminal electrode 27, is formed.

Figure 9:
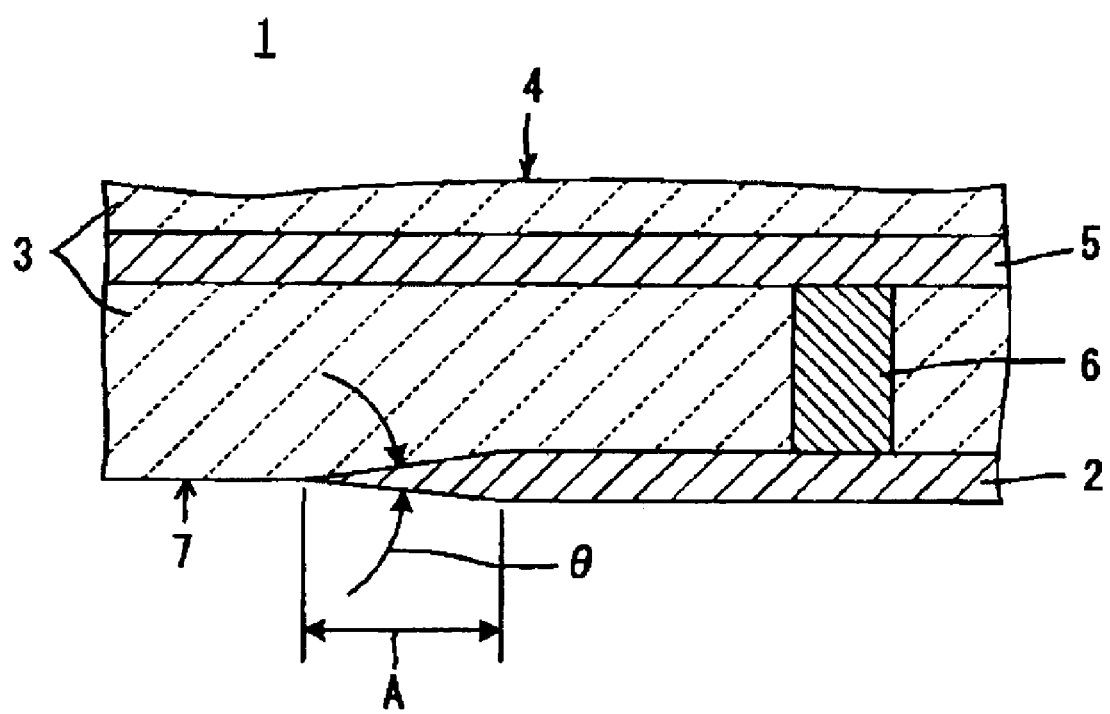
FIG. 9 is a cross-sectional view of a portion of a related art laminated ceramic electronic component which is relevant to the present invention, especially showing a portion of the component 1 where an external terminal electrode 2 is formed.

A thinning portion is also formed in the periphery of the conductive paste film 51. Thus, preferably, the conductive paste film 51 is formed such that the periphery defining the hole 50 formed in the outer-layer ceramic green sheet 48 is extended so as to have a width of at least about 30 $\mu$m. This is because the thinning portion is not located within the hole 50, since the dimension A defining the edge angle (see FIG. 9) is about 30 $\mu$m as described above.

From the standpoint of the high electrical reliability, the conductive paste film is not formed on the outer-layer ceramic green sheet 48 except at the periphery defining the hole 50 as shown in FIG. 1B. However, a conductive paste film which is to be an internal conductor film having the same function as the internal conductor film 24 may be formed, if necessary.

Next, the outer-layer ceramic green sheet 48 lined with the carrier film 49 is arranged to overlap the green laminated main member 45 in a positional relationship as shown in FIG. 1B, i.e., such that the hole 50 and the convexity 47 are arranged with respect to each other. Thereby, a green component main member 52 is obtained as shown in FIG. 1C.

The green component main member 52 shown in FIG. 1C is obtained after the outer-layer ceramic green sheet 48 and the green laminated main member 45 are arranged to overlap each other as described above, and the carrier film 49 is peeled off from the outer-layer ceramic green sheet 48 and pressed in the lamination direction. For the pressing, for example, a pressure of about 100 kg/cm$^2$ to about 1500 kg/cm$^2$ and a temperature in the range of room temperature to about 150° C. are applied.

Figure 2:
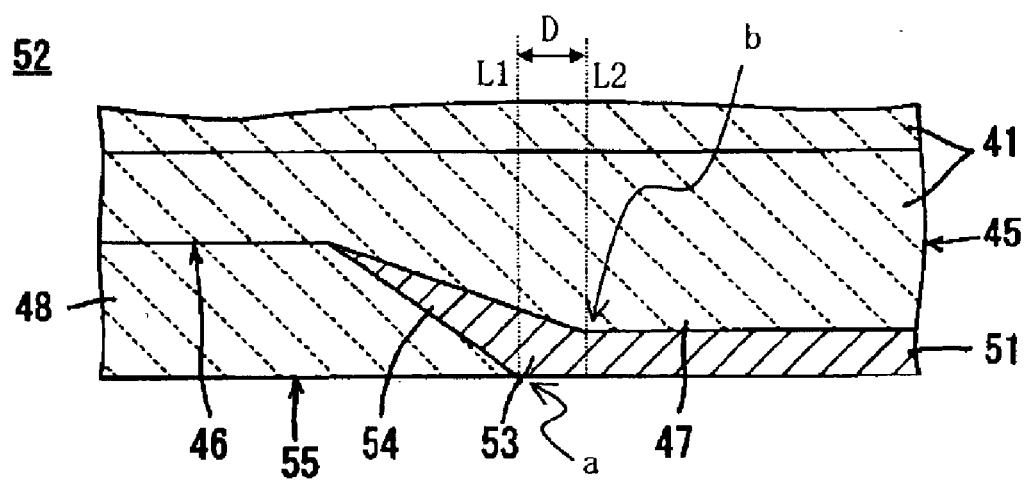
FIG. 2 is an enlarged cross-sectional view of a component of a green component main member 52 shown in FIG. 1C, especially showing a conductive paste film 51 for formation of an external terminal electrode 27.

Behaviors produced in the pressing process will be described with reference to FIG. 2. FIG. 2 is an enlarged cross-sectional view of a portion of the green component main member 52 in which the conductive paste film 51 for the external terminal electrode 27 is formed.

The green laminated main member 45 is made in the stage before the outer-layer ceramic green sheet 48 is arranged to overlap the green laminated main member 45. Thus, the green laminated main member 45 has already been pressed for formation of the convexity 47. Accordingly, the density of the green laminated main member 45 is greater by about 20% to about 40% than that of the outer-layer ceramic green sheet 48. Thus, the green laminated main member 45 is relatively hard.

On the other hand, the conductive paste film 51 which defines the external terminal electrode 27 includes metallic powder. The grain size of the metallic power is relatively small, i.e., in the order of sub-microns to several $\mu$m. Moreover, the conductive paste film 51 includes a resin component in an amount of several tens of percent. Thus, the conductive paste film 51 flows when hot-pressed.

Accordingly, when the green laminated main member 45 and the outer-layer ceramic green sheet 48 are arranged to overlap and are hot-pressed, the green laminated main member 45, which is hard, is not significantly distorted, while the outer-layer ceramic green sheet 48 and the conductive paste film 51 is relatively easily distorted, following the features of the main surface 46 of the green laminated main member 45 having the convexity 47 formed thereon. As a result, in the periphery of the conductive paste film 51, a first bending portion 53 is formed, and an embedded portion 54 is formed so as to be extended and embed in the green component main member 52. The embedded portion 54 corresponds to the embedded portion 32 which is formed in the periphery of the external terminal electrode 27 as described above with reference to FIG. 1D.

Moreover, for the pressing which is carried out after the green laminated main member 45 and the outer-layer ceramic green sheet 48 are arranged to overlap each other, the first main surface 55 of the green component main member 52 onto which the conductive paste film 51 is exposed is made flat with a flat plate mold.

The outer-layer ceramic green sheet 48 and the conductive paste film 51 are more smoothly distorted when the convexity 47 formed in the green laminated main member 45 has a sloped surface as a rising-end surface thereof as described above.

As seen in FIG. 2, the first bending portion 53 includes an outside-bending portion a on the first main surface 55 side and an inside-bending portion b is on the inner side of the component main member. In the example of FIG. 2, the outside bending portion a is located on a first imaginary straight line L1 that is substantially perpendicular to the first main surface 55. The inside bending portion b is located on a second imaginary straight line L2 which is substantially parallel to the first imaginary straight line L1 and does not overlap the line L1. In this case, preferably, the first imaginary straight line L1 is on the embedded portion side, and the second imaginary straight line L2 is on the exposed portion side. Preferably, the distance D between the first imaginary straight line L1 and the second imaginary straight line L2 is in the range of about 2 $\mu$m to about 20 $\mu$m. If the distance D is less than about 2 $\mu$m, the edge angle of the electrode 54 is too sharp, such that the electric field is easily concentrated. Thus, when processing of the laminated ceramic electronic component, an insulator may be broken at a surge voltage such as an electrostatic discharge voltage, so that IR is deteriorated, and other fatal defects such as short-pass are caused. If the distance D exceeds about 20 $\mu$m, the difference between the firing shrinkages of the electrode 54 and the surrounding ceramic is large, and therefore, they may be delaminated (cracking between the layers) at the interface between them. Thus, desired electrical properties cannot be obtained. Moreover, when wet-plating is performed, a plating liquid or a cleaning liquid invades the component, such that deterioration of IR and fatal damages such as short-pass are caused in some cases.

The distance D between the first imaginary straight line L1 and the second imaginary straight line L2 can be changed with the thickness of the conductive paste film 51 shown in FIG. 1B. Particularly, the thickness of the conductive paste film provided on the side wall of the hole 50 greatly influences the distance D. That is, as the thickness of the conductive paste film 51 (especially, the thickness of the side-wall in the hole 50) increases, the distance D increase, and as the thickness decreases, the distance D decreases.

Figure 3:
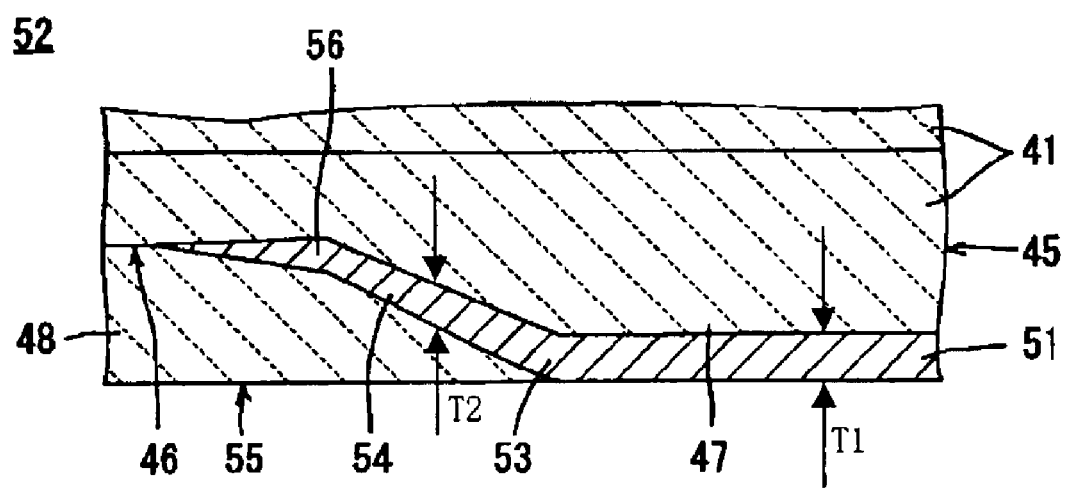
FIG. 3 corresponds to FIG. 2, and shows a modification of the form of the conductive paste film 51.

FIG. 3 corresponds to FIG. 2, and shows a shape-modified example of the form of the conductive paste film 51.

The conductive paste film 51 shown in FIG. 3 includes another bending portion (second bending portion) 56 in addition to the first bending portion 53. Thus, the embedded portion 54 is formed so as to have the two bending portions 53 and 56. The configuration of the conductive paste film 51 shown in FIG. 3 is produced by using the process of forming the conductive paste film 51 as shown in FIG. 1B except that the formation-area is increased such that the area is extended over the area in which the convexity 47 of the green laminated main member 45 is formed.

In this example, the outside bending portion and the inside bending portion of each of the bending portions 53 and 56 are located on one imaginary straight line that is substantially perpendicular to the first main surface 55. However, preferably, in the second bending portion, the outside bending portion and the inside bending portion are located on different imaginary lines (imaginary lines perpendicular to the first main surface), as well as in the first bending portion shown in FIG. 2.

Figure 5:
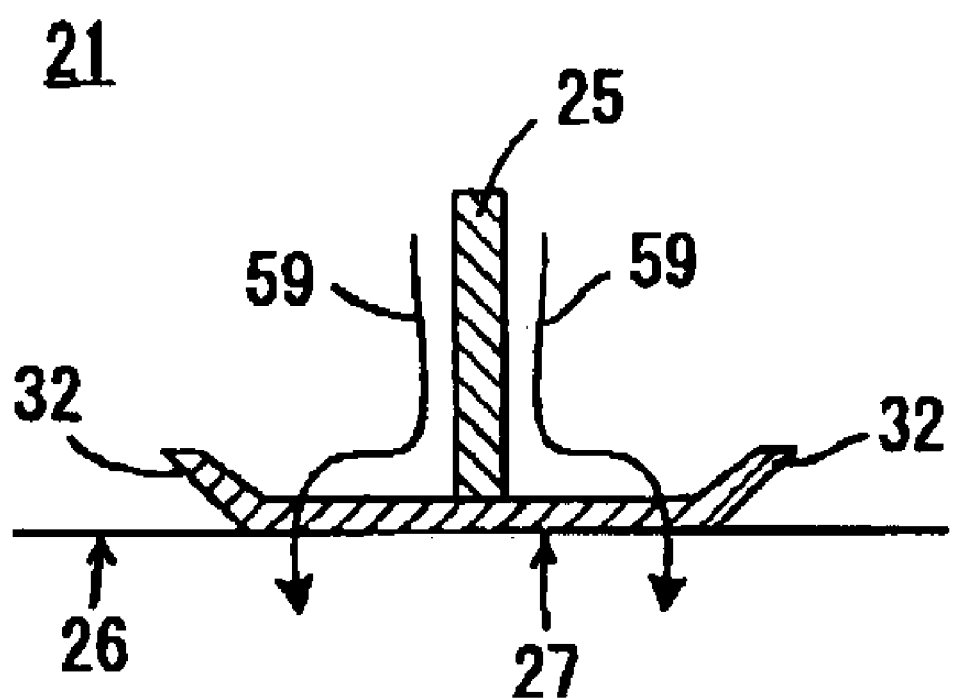
FIG. 5 illustrates an advantage of the present invention, and is a schematic cross-sectional view of the external terminal electrode 27 connected to a viahole conductor 25 of the laminated ceramic electronic component 21 of FIG. 1D.

Moreover, as shown in FIG. 3, the average thickness T2 of the electrode in the embedded portion 54 (in FIG. 3, on the left-hand side of the first bending portion 53) is less than the average thickness of the electrode in the exposed portion. The reason for this is that when the thickness T2 is large, the embedded portion has a low resistance, such that a high frequency signal easily flows therein. Thus, the advantages of the present invention as illustrated in FIG. 5 are very difficult to obtain. Specifically, the average thickness of the embedded portion is preferably in the range of about 2 $\mu$m to about 20 μm, and the average thickness of the embedded portion is preferably in the range of about 4 μm to about 30 μm.

Referring to FIGS. 1C and 1D again, successively, the green component main member 52 shown in FIG. 1C is fired, and thereby, the sintered main member 23 shown in FIG. 1D is obtained. At this time, the ceramic green sheets 41 and the outer-layer ceramic green sheet 48 provided for the green component main member 52 are sintered to form the ceramic layers 22 of the main member 23. Moreover, the conductive paste members 42, and the conductive paste films 43, 44, and 51, provided for the main member 23, are baked while the shapes and sizes thereof are substantially maintained, respectively, to define the viahole conductors 25, the internal conductor films 24, the external conductor films 29, and the external terminal electrodes 27 provided for the main member 23. Moreover, the embedded portion 54 formed in the paste film 52 corresponds to the embedded portion 32 formed in the external terminal electrode 27.

The portions of the external terminal electrodes 27 and the external conductor films 29, exposed on the outer surface of the main member 23, are electro-plated or electroless-plated, such that a nickel plating film is formed, and a gold or tin plating film is formed thereon.

Subsequently, the mounting component 30 is mounted so as to be electrically connected to a predetermined external conductor film 29. For mounting the mounting component 30, for example, solder reflowing, wire-bonding, or bump-connecting is used.

Moreover, the metallic cover 31 shown by the broken line is fixed to the main member 23 so as to cover the mounting component 30.

Figure 4:
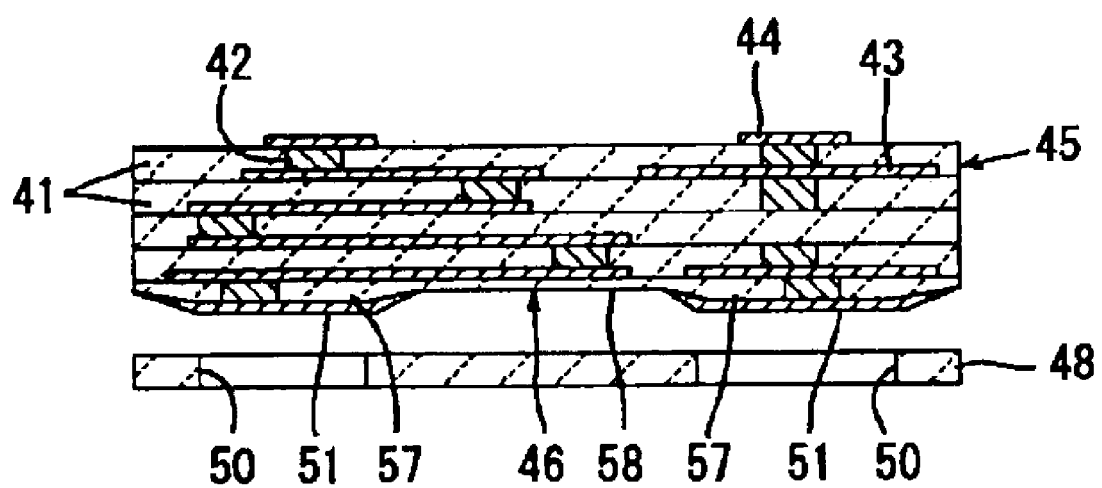
FIG. 4 illustrates a second preferred embodiment of the present invention, and is a cross-sectional view showing a process corresponding to the process of FIG. 1B.

FIG. 4 shows a second preferred embodiment of the present invention, illustrating a process corresponding to that of FIG. 1B. In FIG. 4, components equivalent to those shown in FIGS. 1A to 1D are designated by the same reference numerals, and the description thereof is omitted.

In the second preferred embodiment, the green laminate main member 45 is defined by a plurality of the ceramic green sheets 41, and includes, inside thereof, the conductive paste members 42 which define the viahole conductors 25 and the conductive paste films 43 which define the internal conductor films 24. Moreover, the conductive paste films 44 which define the external conductor films 29 and the conductive paste films 51 which define the external conductor films 29 are formed on the green laminated main member 45.

The conductive paste film 51 may be formed in the stage before the lamination of the ceramic green sheets 41 or may be formed after the green laminated main member 45 is formed.

Subsequently, the green laminated main member 45 is molded to have the configuration shown in FIG. 4.

In particular, the green laminated main member 45 is formed as follows. Convexities 57 are formed in the regions where the conductive paste film 51 are formed, a concavity 58 is formed in the region where the conductive paste film 51 is formed (see FIG. 1D), and the conductive paste film 51 is also located in the boundary between the convexities 57 and the concavity 58.

A metallic mold (not shown) having concavities corresponding to the convexities 57 and a convexity corresponding to the concavity 58 is preferably used to press the green laminated main member 45 in the lamination direction. For the pressing, for example, a pressure of about 100 kg/cm² to about 1500 kg/cm² and a temperature of room temperature to about 150° C. are applied.

Preferably, each conductive paste film 51 which forms the external terminal electrode 27 is formed in an area which is wider by at least about 30 μm than the region where each external terminal electrode 27 are to be formed.

Moreover, preferably, no conductive paste film is formed on the area of the first main surface 46 of the green laminated main member 45 where no external terminal electrodes 27 are to be formed, that is, in the area where the concavity 58 is formed, except in the boundary portion between the convexity 57 and the concavity 58. Thereby, a highly reliable electrical insulation is obtained. However, a conductive paste film may be formed in the area where the concavity 58 is formed, if necessary.

On the other hand, as shown in the lower component of FIG. 4, the outer-layer ceramic green sheet 48 including the holes 50 formed in the regions corresponding to the convexities 57 is prepared. It is not necessary to line the outer-layer ceramic green sheet 48 with the carrier film 49. Moreover, punching is preferably used to form the holes 50 in the outer-layer ceramic green sheet 48.

The outer-layer ceramic green sheet 48 and the green laminated main member 45 are arranged to overlap each other in the positional relationship between them as shown in FIG. 4, and then, are pressed in the lamination direction. Thus, the green component main member 52 shown in FIG. 1C is obtained.

Thereafter, processes similar to those in the first preferred embodiment are performed. Thus, the laminated ceramic electronic component 21 sown in FIG. 1D is produced.

The laminated ceramic electronic component 21 produced according to the first or second preferred embodiments has the following advantages.

Figure 10:
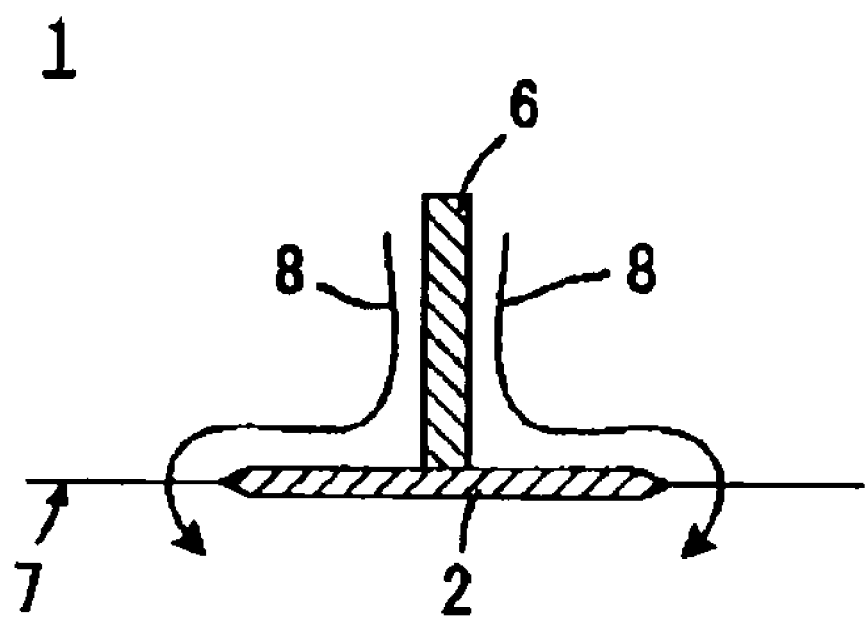
FIG. 10 illustrates problems which the laminated ceramic electronic component 1 shown in FIG. 9 encounters, and is a schematic cross-sectional view of the external terminal electrode 2 connected to a viahole conductor 6.

FIG. 5 corresponds to FIG. 10 and is a schematic cross-sectional view of the external terminal electrode 27 connected to the viahole conductor 25 in the laminated ceramic electronic component 21.

As seen in FIG. 5, a small current flows through the viahole conductor 25 into the external terminal electrode 27. As the frequency of the current increases, the surface skin effect increases. Thus, the current flows near the surface of the external terminal electrodes 27. However, in this preferred embodiment, the peripheral portion of the external terminal electrodes 27 is bent, such that the current flows as shown by arrows 59. Thus, the current is less influenced by the edges of the external terminal electrode 27. Therefore, the behavior of the current is the same as that which occurs when the edge angle θ is about 180 degrees. Thus, the loss is greatly reduced.

Figure 11:
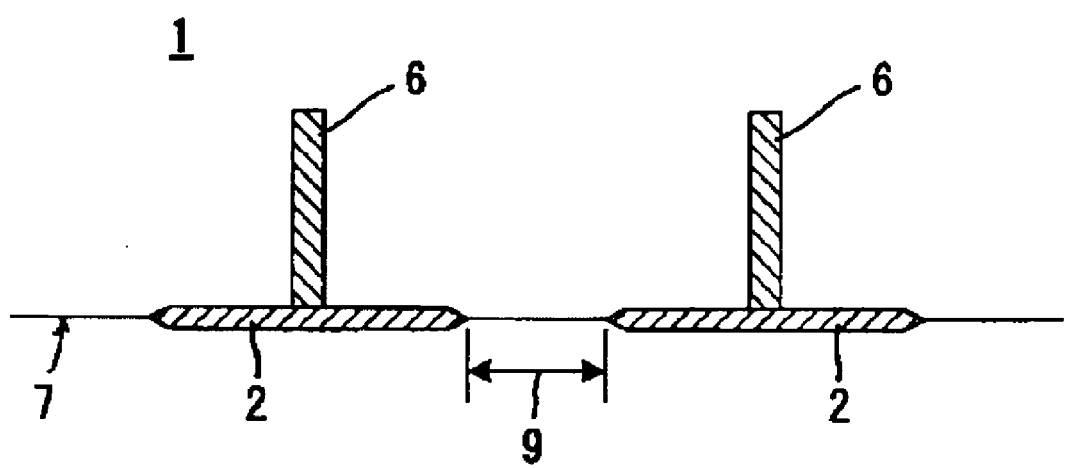
FIG. 11 illustrates other problems which the laminated ceramic electronic component 1 shown in FIG. 9 encounters, and is a schematic cross-sectional view of two adjacent external terminal electrodes 2 connected to two viahole conductors 6, respectively.

Referring to FIG. 11, the above-described problems are eliminated. That is, even if the two external terminal electrodes 27 are arranged near to each other as shown in the external terminal electrodes 2 of FIG. 11, the withstand voltage property is greatly improved since the edges of the external terminal electrodes 27 are embedded in the ceramic having a high electrical insulating property.

Figure 6:
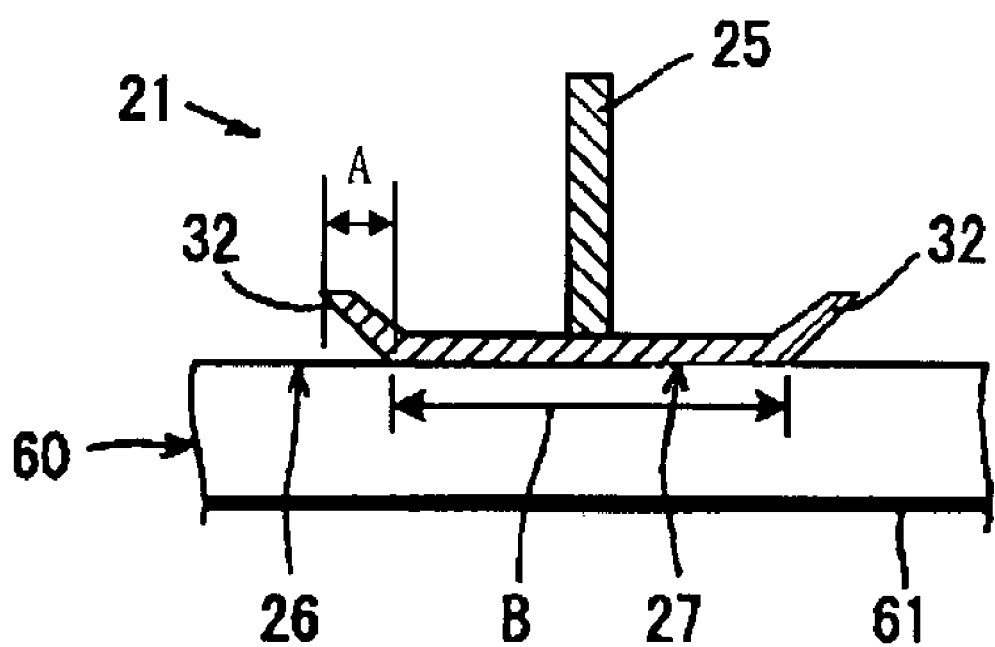
FIG. 6 illustrates another advantage of the present invention, and is a schematic cross-sectional view showing the positional relationship between the external terminal electrode 27 of the laminated ceramic electronic component 21 mounted on a mounting substrate 60 and a ground conductor 61.
Figure 12:
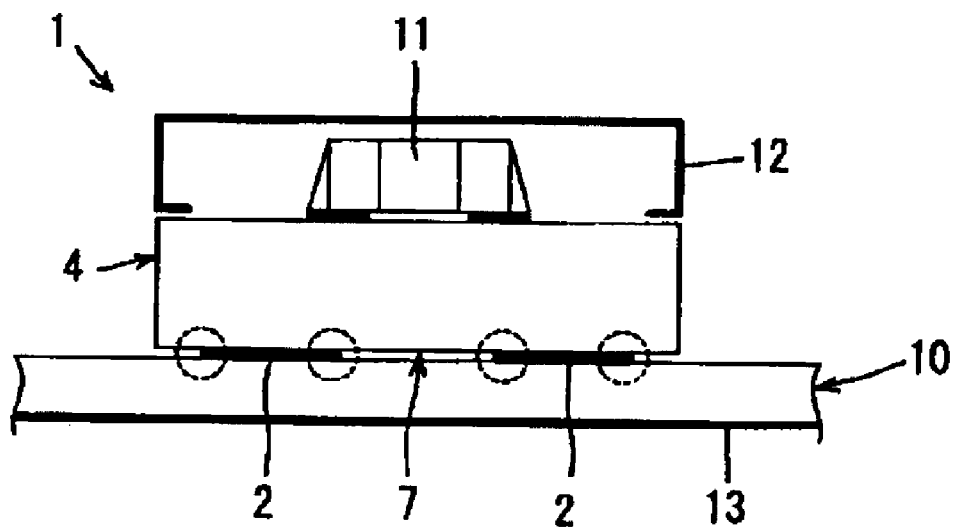
FIG. 12 illustrates other problems which the laminated ceramic electronic component 1 shown in FIG. 9 encounters, and is a schematic cross-sectional view of the laminated ceramic electronic component 1 mounted onto a mounting substrate 10.

Moreover, referring to FIG. 12, the above-described problems are also eliminated. FIG. 6 is a schematic cross-sectional view of the laminated ceramic electronic component 21 mounted on a mounting substrate 60, showing the positional relationship between the external terminal electrode 27 and a ground conductor 61 formed on the mounting substrate 60 side.

Referring to FIG. 6, the external terminal electrodes 27 provided with the laminated ceramic electronic component 21 include the embedded portion 32 formed in the periphery thereof. Thus, current flows only in the component B of the external terminal electrode 27 which is near the ground conductor 61, i.e., which is exposed on the first main surface side. Accordingly, the current is not influenced by the edge angle θ of the external terminal electrode 27. Thus, the loss caused by the reduced edge angle θ is greatly reduced.

The case in which the external terminal electrodes 27 are plated will be described with reference to FIG. 6. The plating may be performed on the exposed component B of the external terminal electrode 27. The exposed component B, excluding the thin edges of the external terminal electrode 27, has a high coverage property. Thus, the component B has a superior plating property.

In view of the above-described behaviors and causes, preferably, the ratio (A/B) of the length A (the length in parallel to the first main surface) of the embedded portions to the length B (the length in parallel to the first main surface) of the exposed portion of the external terminal electrode 27 is in the range of about 1:2 to about 1:30. Preferably, the length A of the embedded portions is in the range of about 30 μm to about 200 μm.

In the above-described preferred embodiment, ordinarily, the external terminal electrode 27 has a substantially rectangular flat surface shape to satisfy the requirement that the area for electrical connection between the external terminal electrode 27 and the mounting substrate should be made as wide as possible. Thus, in the case of the substantially rectangular external terminal electrode 27, preferably, the embedded portions 32 are formed on the four sides of the electrode 27.

Preferably, the peripheral edge portion of the external terminal electrode 27 includes an area which is extended in an arc shape in the plan view, more preferably, in a substantially circular or substantially elliptical shape. In this case, preferably, the embedded portion 32 is formed in the entire periphery of the external terminal electrode 27.

According to preferred embodiments of the present invention, the external terminal electrode may be provided along a component side of the first main surface of the component main member. Preferred embodiments will be described below with reference to FIGS. 7 and 8.

Figure 7:
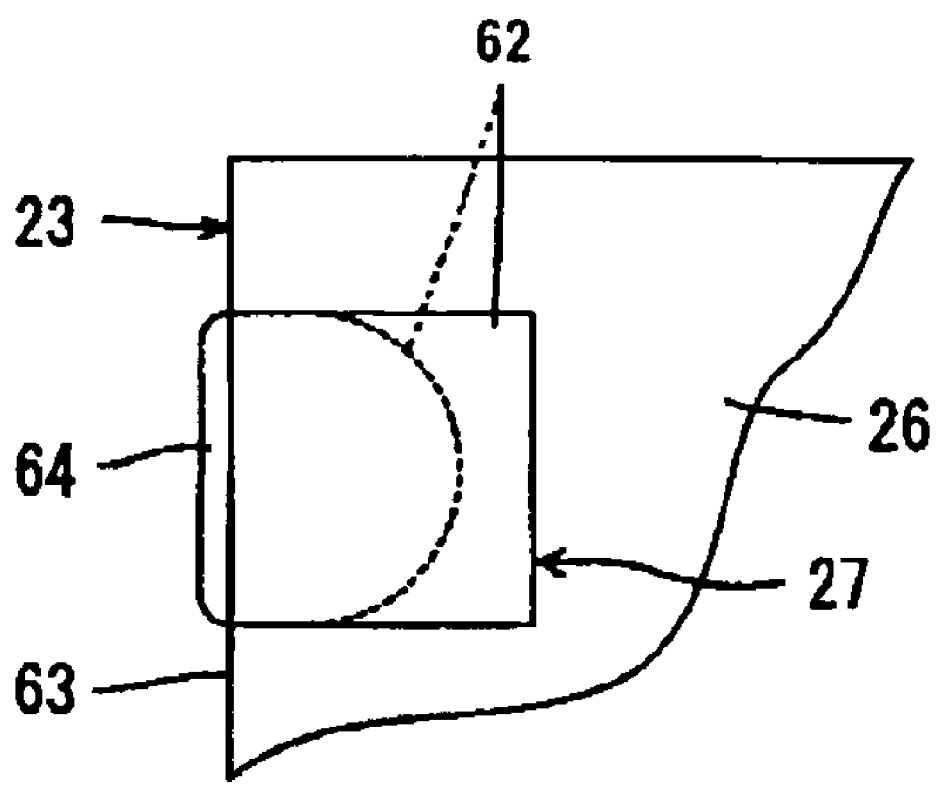
FIG. 7 illustrates a third preferred embodiment of the present invention, and shows a portion of a component main member 23 viewed from the main surface 26 side.
Figure 8:
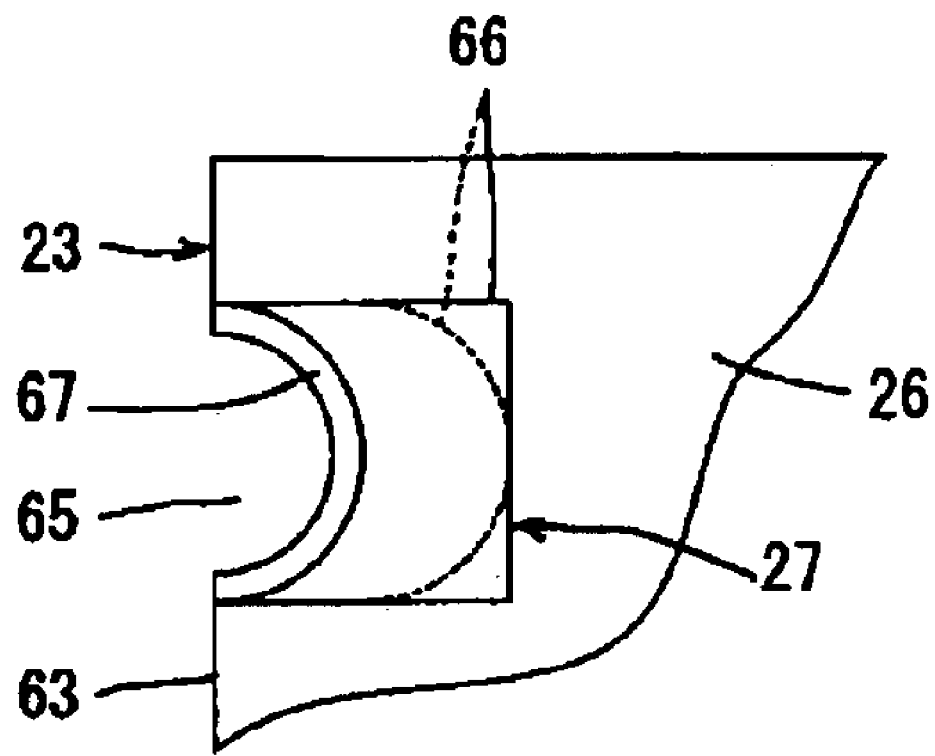
FIG. 8 illustrates a fourth preferred embodiment of the present invention, and shows a portion of the component main member 23 viewed from the main surface 26 side.

FIGS. 7 and 8 illustrate third and fourth preferred embodiments of the present invention, respectively, both showing a portion of the component main member 23 from the first main surface 26 side.

In the third preferred embodiment of FIG. 7, the external terminal electrode 27 includes a component 62 arranged on the main surface 26 of the component main member 23 and a component 63 arranged on a side surface 63 which are continuous to each other. In particular, FIG. 7 is a schematic view of the external terminal electrode 27 having a substantially U-shaped configuration so as to extend over the first main surface 26, the side surface 63, and the second main surface (not shown) of the component main member 23. In this Figure, the component 64 of the external terminal electrodes 27 is shown as the component in the thickness direction of the external terminal electrode 27. The portion of the external terminal electrode 27 arranged on the first main surface 26 is a bending portion which is provided so as to cover the edge of the component main member. In this preferred embodiment, the component on the left-side of the half-circular dotted line in the drawing of the external terminal electrode 27 is a component exposed on the first main surface 26 of the component main member 23. The right-side of the half-circular dotted line is an embedded component.

In the fourth preferred embodiment of FIG. 8, a notch 65 is provided on the side surface of the component main member 23. The external terminal electrode 27 includes a component 66 arranged on the main surface 26 and a component 67 arranged in the inner surface of the notch 65 which are continuous to each other. In particular, FIG. 8 is a schematic view of the external terminal electrode 27 configured to have a substantially U-shaped configuration so as to extend over the first main surface 26, the side surface 63, and the second main surface (not shown) of the component main member 23, the external terminal electrode 27 including the notch 65 on the side surface 63. In this figure, the component 67 of the external terminal electrode 27 is shown as the component in the thickness direction of the external terminal electrode 27. The portion of the external terminal electrode 27 arranged on the first main surface 26 is a bending portion which is arranged to cover the edge of the component main member. In this preferred embodiment, the component on the left-side of the half-circular dotted line in the drawing of the external terminal electrode 27 is a component exposed on the first main surface 26 of the component main member 23. The right-side of the half-circular dotted line is an embedded component.

In the first and second preferred embodiments, embedded portions (not shown) are provided in the peripheries of only the components 62 and 66 of the external terminal electrodes 27, respectively. In the external terminal electrodes 27, the component 64 arranged on the side surface 63 and the component 67 arranged on the notch 65 are continuously formed. Thus, these components do not have loss in the edge portion.

The components 62 and 66 arranged on the main surfaces of the external terminal electrodes 27 have a portion that extends in an arc shape in the plan view in the periphery thereof, as shown by the broken lines in FIGS. 7 and 8, respectively.

Next, a fifth preferred embodiment of the present invention will be described with reference to FIG. 13.

Figure 13:
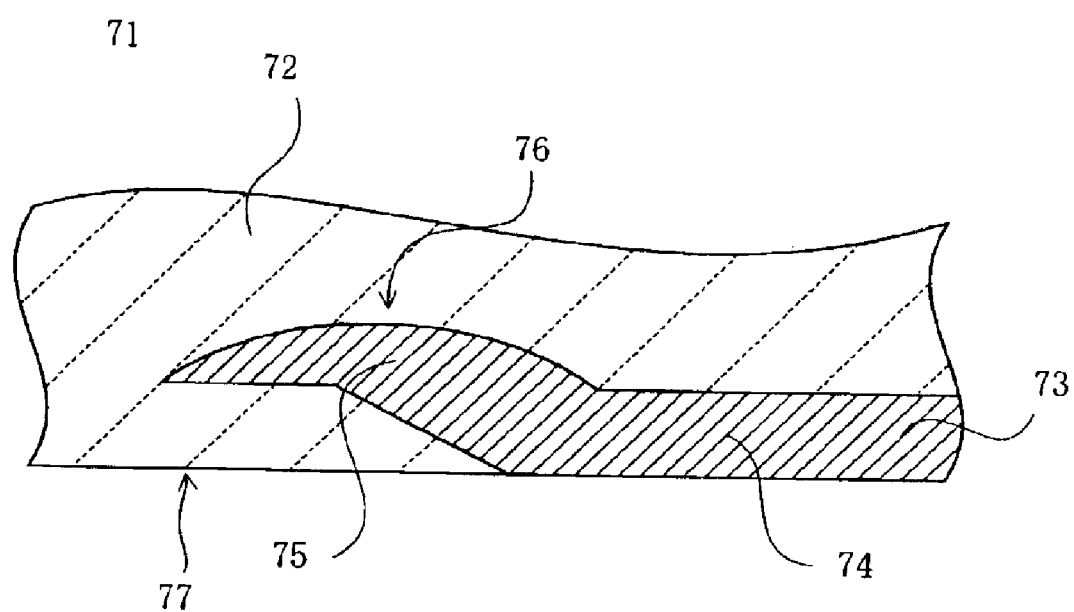
FIG. 13 illustrates a fifth preferred embodiment of the present invention, and is an enlarged cross-sectional view of a portion of the component main member.

In a laminated ceramic electronic component 71 shown in FIG. 13, an external terminal electrode 72 includes an exposed portion 74 exposed on a first main surface 77 of a component main member 72 and an embedded portion 75 extending into and embedded in the component main member 72. The portion of the embedded portion 75 facing the inside of the component main member 72 is configured in an arc shape. That is, the surface on the inside of the component main member of the embedded portion 75 has an R. Thus, stress concentration in the boundary between the component defined by the ceramic layers and the embedded portion made from conductive paste are relaxed, and thus, generation of cracks is prevented.

Next, a sixth preferred embodiment will be described with reference to FIG. 14.

Figure 14:
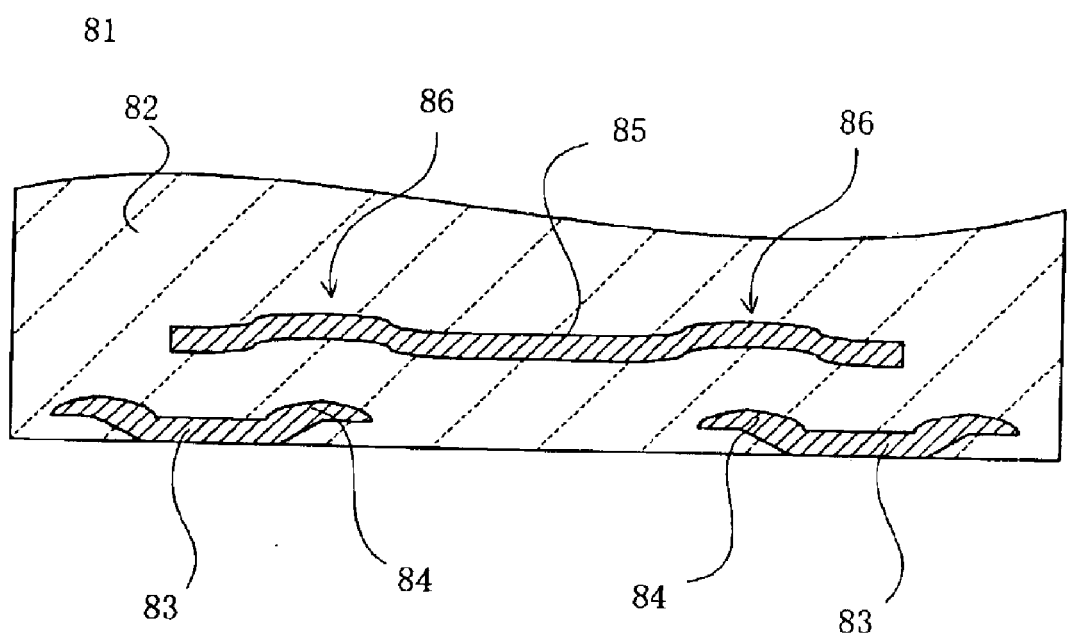
FIG. 14 illustrates a sixth preferred embodiment of the present invention, and is an enlarged cross-sectional view of a portion of the component main member.

In a laminated ceramic electronic component 81 of FIG. 14, a ground electrode 85 is provided in a component main member 82 so as to be opposed to an external terminal electrode 83 substantially in parallel to the first main surface of the component main member 82. This ground electrode is arranged in opposition to a plurality of external terminal electrodes. A concavity 86 is provided in the portion of the ground electrode 85 which is in opposition to an embedded portion 84 of the external terminal electrode 83, the concavity having a shape and size that corresponds to that of the embedded portion 84. Thus, since the distance between the ground electrode 85 and the embedded portion 84 is substantially constant, a stray capacitance generated between them is constant. Thus, the electrical properties are greatly improved. Also, when a surge voltage, which is an electrostatic discharge voltage, is applied, concentration of the electric field is effectively prevented. The electric field is uniformly applied, and thus, advantageously, the withstanding voltage property is greatly improved.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A laminated ceramic electronic component which is mounted on a mounting substrate, comprising:
    a component main member including a plurality of ceramic layers;
    an internal circuit element provided inside the component main member; and
    an external terminal electrode provided on a first main surface of the component main member and electrically connected to the mounting substrate; wherein
    the external terminal electrode includes an exposed portion that is exposed at the first main surface and an embedded portion that extends into at least a portion of the peripheral edge of the exposed portion so as to be embedded in the component main member.

2. A laminated ceramic electronic component according to claim 1, wherein the embedded portion of the external terminal electrode comprises a first bending portion provided in the peripheral edge of the exposed portion of the external terminal electrode.

3. A laminated ceramic electronic component according to claim 2, wherein the embedded portion of the external terminal electrode further comprises a second bending portion in communication with the first bending portion.

4. A laminated ceramic electronic component according to claim 2, wherein the first bending portion comprises an outside bending portion and an inside bending portion, the outside bending portion is arranged on a first imaginary straight line that is substantially perpendicular to the first main surface, and the inside bending portion is arranged on a second imaginary straight line that is substantially parallel to the first imaginary straight line and not overlapping the first imaginary straight line.

5. A laminated ceramic electronic component according to claim 4, wherein the first imaginary straight line is located on the imbedded portion side with respect to the second imaginary straight line, and the distance between the first imaginary straight line and the second imaginary straight line is in the range of about 2 $\mu$m to about 20 $\mu$m.

6. A laminated ceramic electronic component according to claim 1, wherein the peripheral edge of the external terminal electrode includes an area which extends in an arc-shape in plan view.

7. A laminated ceramic electronic component according to claim 1, wherein the embedded portion extends along a length of at least about 30 $\mu$m substantially in parallel to the first main surface of the component main member.

8. A laminated ceramic electronic component according to claim 1, wherein the external terminal electrode is electrically connected to the internal circuit element.

9. A laminated ceramic electronic component according to claim 1, wherein the average thickness of the embedded portion is less than the thickness of the exposed portion.

10. A laminated ceramic electronic component according to claim 9, wherein the average thickness of the embedded portion is in the range of about 2 $\mu$m to about 20 $\mu$m, and the thickness of the exposed portion is in the range of about 4 $\mu$m to about 30 $\mu$m.

11. A laminated ceramic electronic component according to claim 1, wherein the embedded portion is arranged so as to be extended toward the inside of the component main member in an arch shape.

12. A laminated ceramic electronic component according to claim 1, further comprising a ground electrode provided in the component main member in opposition to the external terminal electrode, the ground electrode having a concavity provided therein and having a shape and size corresponding to that of the embedded portion of the external terminal electrode.

* * * * *